United States Patent
Park

(10) Patent No.: US 7,924,030 B2
(45) Date of Patent: Apr. 12, 2011

(54) TEST PATTERN FOR ANALYZING CAPACITANCE OF INTERCONNECTION LINE

(75) Inventor: Chan Ho Park, Goyang-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 256 days.

(21) Appl. No.: 12/337,855

(22) Filed: Dec. 18, 2008

(65) Prior Publication Data

US 2009/0167338 A1 Jul. 2, 2009

(30) Foreign Application Priority Data

Dec. 26, 2007 (KR) .......................... 10-2007-0137188

(51) Int. Cl.
*G01R 27/26* (2006.01)
(52) U.S. Cl. ....................................... 324/686; 324/658
(58) Field of Classification Search .................. 324/658, 324/686, 687; 257/532
See application file for complete search history.

(56) References Cited

U.S. PATENT DOCUMENTS

| | | | |
|---|---|---|---|
| 6,870,387 B2 * | 3/2005 | Huang et al. | 324/658 |
| 2003/0071641 A1 * | 4/2003 | Armbruster | 324/687 |

* cited by examiner

*Primary Examiner* — Vincent Q Nguyen
(74) *Attorney, Agent, or Firm* — Workman Nydegger

(57) ABSTRACT

Disclosed is a test pattern for analyzing capacitances of interconnection lines that accounts for parasitic capacitance components. The test pattern includes a first metal line having a comb-type structure including a plurality of tines, a second metal line having a comb-type structure including a plurality of tines engaged with the tines of the first metal line, a first probe pad switchably connected to the first metal line, and a second probe pad switchably connected to the second metal line. Switchable connections between the first metal line and the first probe pad and between the second metal line and the second probe pad may be provided by first and second switch terminals, respectively. The test pattern enables a capacitance measurement that accounts for parasitic capacitance components of pads and portions of interconnection lines leading from the pads, which otherwise interfere with accurate measurement of capacitances of the interconnection lines.

7 Claims, 4 Drawing Sheets

REPLACEMENT SHEET
FIG. 1 --PRIOR ART--
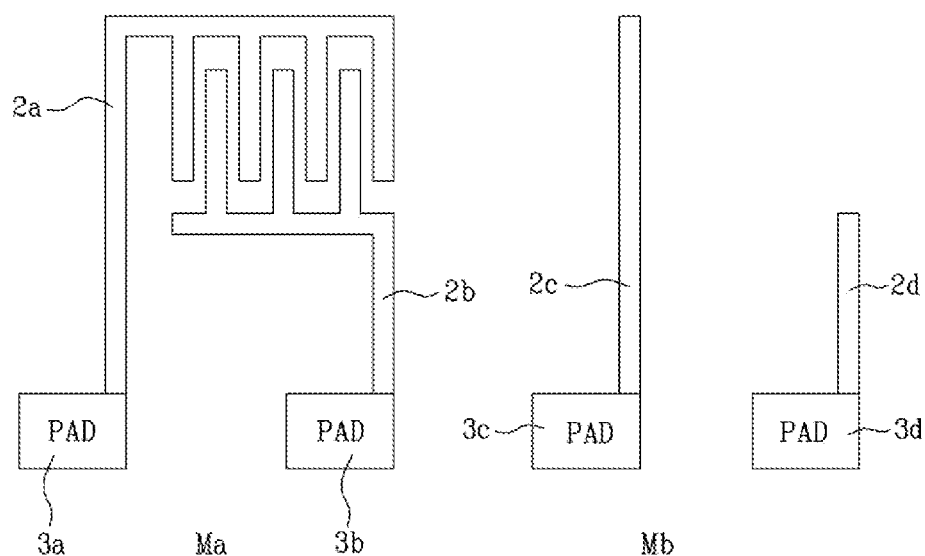
FIG. 2 --PRIOR ART--
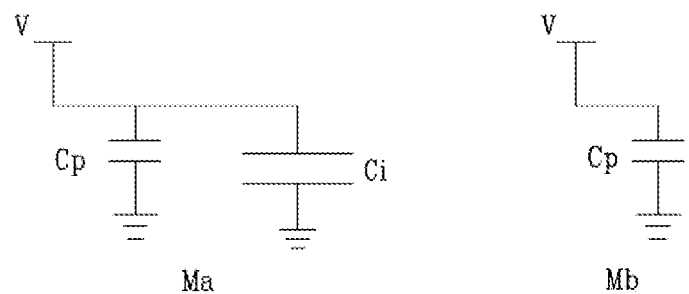

TEST PATTERN FOR ANALYZING CAPACITANCE OF INTERCONNECTION LINE

CROSS-REFERENCE TO RELATED APPLICATION

This application claims the benefit of Korean Patent Application No. 10-2007-0137188, filed on 26 Dec. 2007, which is hereby incorporated by reference in its entirety.

BACKGROUND OF THE INVENTION

1. Field of the Invention

Embodiments of the present invention relate to a test pattern for analyzing capacitances of interconnection lines in a semiconductor device.

2. Discussion of the Related Art

In general, a comb-type capacitor or a plate-type capacitor has been used as a test pattern for measuring and analyzing capacitances of interconnection lines to exhibit characteristics of the interconnection lines in a semiconductor device.

In the test pattern, pads for probing are connected to capacitor Devices Under Test (DUTs) through the interconnection lines. However, a capacitance value, as measured by probes connected to the pads, is higher than the actual capacitance value of interest.

The reason for this measurement discrepancy is that parasitic capacitance components attributable to the pads and portions of the interconnection lines leading from the pads induce inexact capacitance values in the measurement and analysis of capacitances of the interconnection lines.

Thus, a method for measuring and analyzing capacitances of interconnection lines using a null pad pattern, which is separately provided to determine parasitic capacitance components, is conventionally applied.

Hereinafter, a general test pattern for analyzing capacitances of interconnection lines and accounting for parasitic capacitance components using a null pad pattern will be described with reference to FIGS. 1 and 2.

FIG. 1 is a view illustrating the test pattern for analyzing capacitances of interconnection lines and accounting for parasitic capacitance components using a null pad pattern.

As shown in FIG. 1, the conventional test pattern for analyzing capacitances of interconnection lines in a way that accounts for parasitic capacitance components includes a comb-type capacitor module (Ma), and a null pad module (Mb) for determining parasitic capacitance components.

The comb-type capacitor module (Ma) includes a first metal line $2a$ having a comb-type structure including a plurality of tines and a second metal line $2b$ having a comb-type structure including a plurality of tines engaged with (i.e., formed between alternate ones of) the tines of the first metal line $2a$. The comb-type capacitor module (Ma) also includes a first probe pad $3a$ connected to an end terminal of the first metal line $2a$, and a second probe pad $3b$ connected to an end terminal of the second metal line $2b$.

The null pad module (Mb) includes third and fourth metal lines $2c$ and $2d$, each of which has a linear structure, and third and fourth probe pads $3c$ and $3d$, respectively connected to end terminals of the third and fourth metal lines $2c$ and $2d$.

Now, the above test pattern will be described in detail with reference to a circuit diagram and algebraic expressions below.

FIG. 2 is a circuit diagram representative of FIG. 1.

In the comb-type capacitor module (Ma) and the null pad module (Mb) of FIG. 2, Cp represents a parasitic capacitance component due to the pads and lines $2c$ and $2d$ leading from the pads, and Ci represents a capacitance of a main interconnection line, which is of interest for modeling, i.e., the capacitance of a main capacitor DUT corresponding to the tines of the comb-structures, as shown in FIG. 1. The relation between these numerical values is obtained by the following algebraic expressions.

$Cta = Cp + Ci$ $Ctb = Cp$ $Ci = Cta - Ctb$

Here, Cta represents the total capacitance measured by the comb-type capacitor module (Ma), and Ctb represents the total capacitance measured by the null pad module (Mb).

Parasitic capacitance can be measured by the above-described method. However, the null pad module, which is additionally provided to determine the capacitance Ci required to exhibit characteristics of the interconnection lines in the semiconductor device, occupies valuable space in the semiconductor device.

SUMMARY OF SOME EXAMPLE EMBODIMENTS

In general, example embodiments of the invention relate to a test pattern for analyzing capacitances of interconnection lines.

For example, embodiments of the present invention relate to providing a test pattern that can be used to determine parasitic capacitance components of pads and portions of interconnection lines leading from the pads to precisely determine and analyze capacitances of the interconnection lines and account for the parasitic capacitance components.

According to one embodiment, a test pattern for analyzing capacitances of interconnection lines and accounting for parasitic capacitance components includes a first metal line to which a first switch terminal and a first probe pad are connected, a second metal line to which the first switch terminal is connected, a third metal line to which a second switch terminal is connected, and a fourth metal line to which the second switch terminal and a second probe pad are connected.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which:

FIG. 1 is a view illustrating a general test pattern for analyzing capacitances of interconnection lines and accounting for parasitic capacitance components using a null pad pattern;

FIG. 2 is a circuit diagram representative of FIG. 1;

FIG. 5A is a view illustrating the test pattern when the switch of FIG. 3 is turned on;

DETAILED DESCRIPTION OF SOME EXAMPLE EMBODIMENTS

Figure 3:
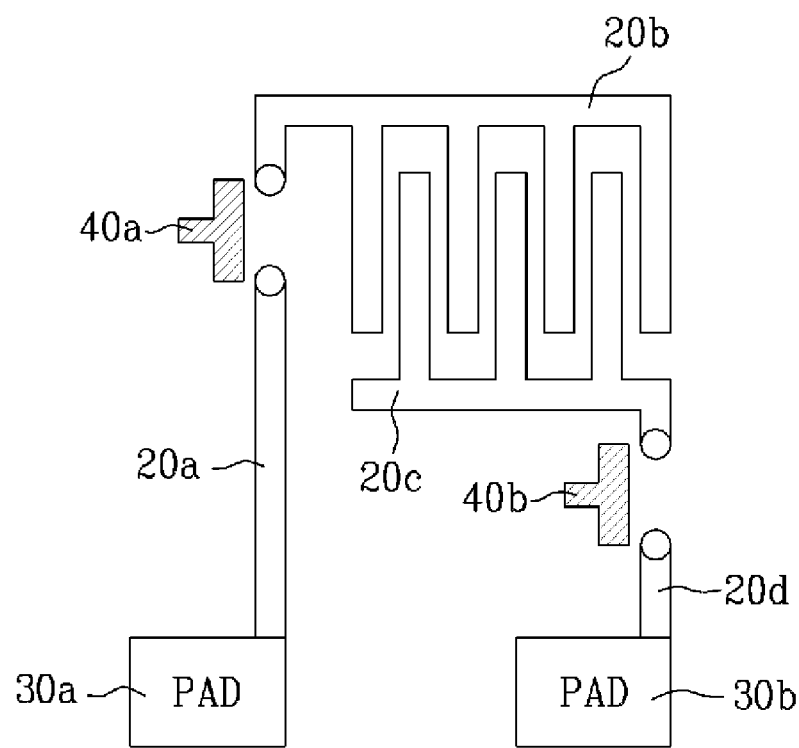
FIG. 3 is a view illustrating a test pattern with a switch for analyzing capacitances of interconnection lines and accounting for parasitic capacitance components in accordance with an embodiment of the present invention.

In the following detailed description of the example embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Hereinafter, an embodiment of a test pattern for analyzing capacitances of interconnection lines and accounting for parasitic capacitance components will be described in detail with reference to the accompanying drawings.

Figure 4:
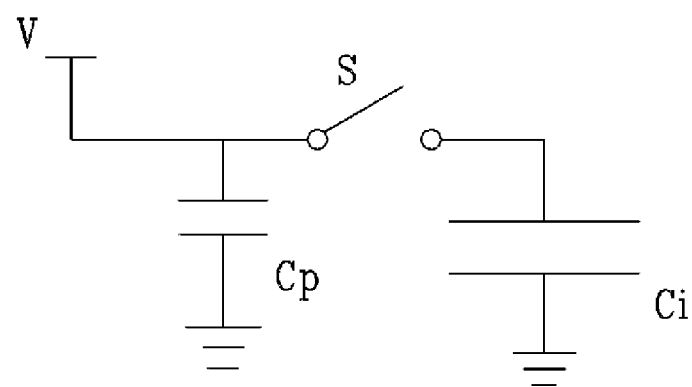
FIG. 4 is a circuit diagram representative of FIG. 3.

FIG. 3 is a view illustrating the test pattern with a switch for analyzing capacitances of interconnection lines. The test pattern with the switch accounts for parasitic capacitance components. FIG. 4 is a circuit diagram representative of FIG. 3.

As shown in FIG. 3, the test pattern includes a first metal line $20a$ provided with end terminals, to which a first probe pad $30a$ and a first switch terminal $40a$ are respectively connected, and a second metal line $20b$ having a comb-type structure including a plurality of tines and provided with an end terminal, to which the first switch terminal $40a$ is connected. The test pattern also includes a third metal line $20c$ having a comb-type structure including a plurality of tines engaged with the tines of the second metal line $20b$ and provided with an end terminal, to which a second switch terminal $40b$ is connected, and a fourth metal line $20d$ provided with end terminals, to which the second switch terminal $40b$ and a second probe pad $30b$ are respectively connected.

In FIG. 4, Cp represents a parasitic capacitance component attributable to the pads $30a$ and $30b$ and to the metal lines $20a$ and $20d$ leading from the pads, Ci represents a capacitance of a main interconnection line, which is of interest for modeling, and S represents a switch.

The first and second switch terminals $40a$ and $40b$ may be operated simultaneously. By simultaneously operating the first and second switch terminals $40a$ and $40b$, as described above, a single switching control panel (not shown) for turning on and off the switch terminals suffices.

Now, an example method of operating the above test pattern for analyzing capacitances of interconnection lines while accounting for parasitic capacitance components will be described.

Figure 5A:
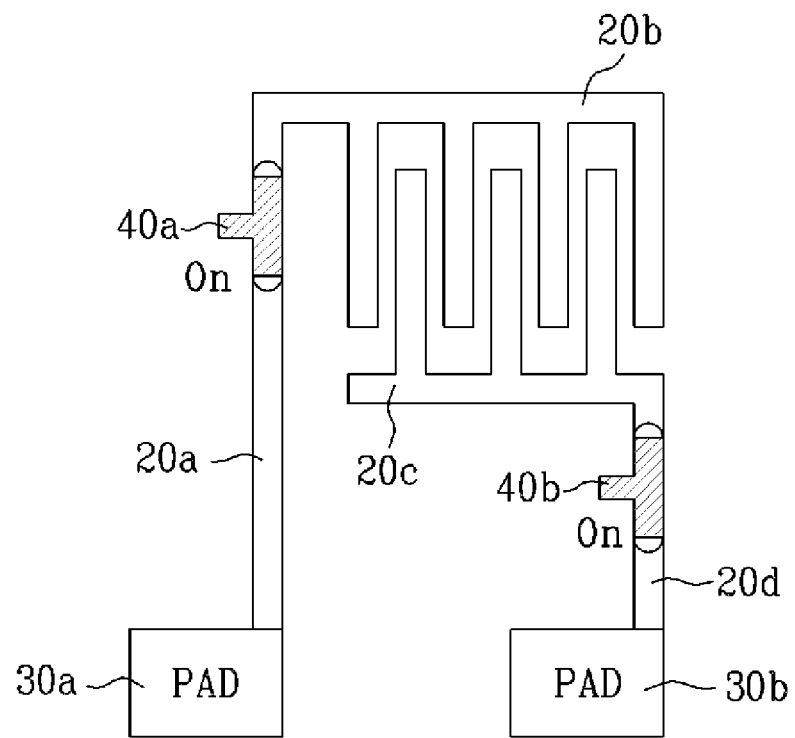
Figure 5B:
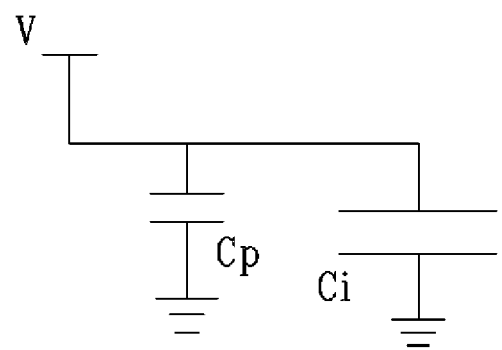
FIG. 5B is a circuit diagram representative of FIG. 5A.

First, when the first and second switch terminals $40a$ and $40b$ are simultaneously turned on, as shown in FIGS. 5A and 5B, a first total capacitance Cta including the capacitance Ci of a main capacitor DUT is measured.

Figure 6A:
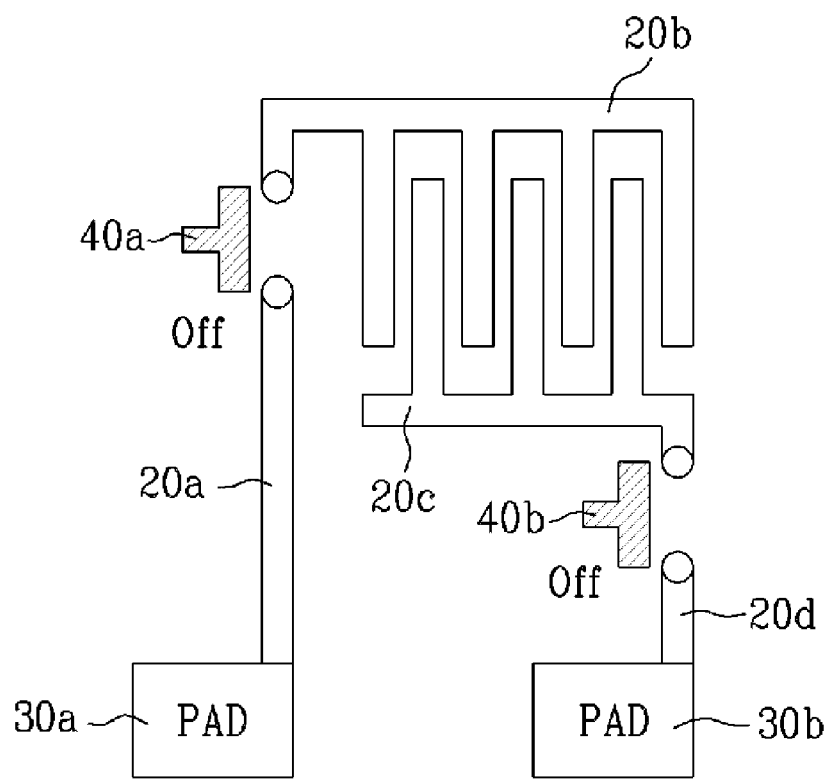
FIG. 6A is a view illustrating the test pattern when the switch of FIG. 3 is turned off.
Figure 6B:
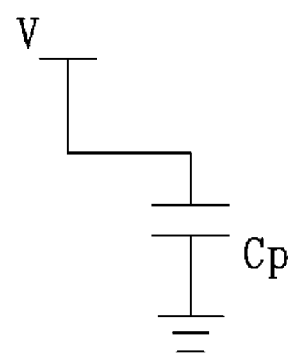
FIG. 6B is a circuit diagram representative of FIG. 6A.

Thereafter, when the first and second switch terminals $40a$ and $40b$ are simultaneously turned off, as shown in FIGS. 6A and 6B, a second total capacitance Ctb excluding the capacitance Ci of the main capacitor DUT is measured.

Then, the capacitance Ci of the main capacitor DUT may be obtained by subtracting the second measured total capacitance Ctb from the first measured total capacitance Cta.

Therefore, the test pattern can form a single module, which serves as a comb-type capacitor module and a null pad module simultaneously.

Consequently, the test pattern of FIG. 3 saves space and measuring time as compared to the conventional test pattern in FIG. 1.

Although the test pattern for analyzing capacitances of interconnection lines and accounting for parasitic capacitance components is described above in the context of using a comb-type capacitor, the test pattern may be applied to other kinds of capacitors, which are used to exhibit characteristics of interconnection lines.

The test pattern formed in accordance with the example embodiment described above enables determination of parasitic capacitance components of pads and portions of interconnection lines leading from the pads, which interfere with accurate measurement of capacitances of the interconnection lines. Thus capacitances of the interconnection lines may be determined and analyzed precisely.

Further, the test pattern formed in accordance with the example embodiment described above saves space compared with a conventional test pattern. In addition, capacitance of a main DUT and parasitic capacitance components may be measured with one probing, thereby reducing the number of times a probe card or a probe positioner is moved by half and thus cutting down an estimated time for measuring by half.

While the present invention has been described with respect to example embodiments, it will be apparent to those skilled in the art that various changes and modifications may be made without departing from the scope of the present invention as defined in the following claims.

What is claimed is:

1. A method for analyzing a test pattern for analyzing capacitances of interconnection lines and accounting for parasitic capacitance components comprising:

forming first to fourth metal lines;

forming a first switch terminal and a first probe pad, which are connected to the first metal line;

connecting the first switch terminal to the second metal line;

forming a second switch terminal, which is connected to the third metal line;

connecting the second switch terminal and a second probe pad to the fourth metal line;

measuring a first total capacitance including a main capacitance when the first and second switch terminals are simultaneously turned on;

measuring a second total capacitance excluding the main capacitance when the first and second switch terminals are simultaneously turned off; and obtaining the main capacitance by subtracting the second total capacitance from the first total capacitance.

2. The method according to claim 1, wherein the main capacitance is the capacitance of a DUT.

3. The method according to claim 1, wherein the first and second switch terminals are configured such that they are simultaneously operated.

4. The method according to claim 1, wherein each of the second and third metal lines has a comb-type structure including a plurality of tines.

5. The method according to claim 4, wherein the second and third lines are configured such that tines of the second metal line are engaged with tines of the third metal line.

6. The method according to claim 1, wherein the width of the first metal line and the width of the fourth metal line are substantially the same.

7. The method according to claim 1, wherein the width of the second metal line and the width of the third metal line are substantially the same.

* * * * *